US012781388B2

(12) United States Patent
Ghosh et al.

(10) Patent No.: US 12,781,388 B2
(45) Date of Patent: Nov. 3, 2026

(54) THERMAL MONITOR FOR HIGH PRESSURE PROCESSING

(71) Applicant: ASM IP Holding B.V., Almere (NL)

(72) Inventors: Sandeep Ghosh, Chandler, AZ (US); Robinson James, Phoenix, AZ (US); Caleb Miskin, Mesa, AZ (US); Amir Kajbafvala, Chandler, AZ (US); Arun Murali, Tempe, AZ (US); Frederick Aryeetey, Phoenix, AZ (US); Alexandros Demos, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 377 days.

(21) Appl. No.: 18/397,635

(22) Filed: Dec. 27, 2023

(65) Prior Publication Data

US 2024/0218560 A1 Jul. 4, 2024

Related U.S. Application Data

(60) Provisional application No. 63/477,713, filed on Dec. 29, 2022.

(51) Int. Cl.
*C30B 25/16* (2006.01)
*C23C 16/24* (2006.01)
(Continued)

(52) U.S. Cl.
CPC .............. *C30B 25/16* (2013.01); *C23C 16/24* (2013.01); *C23C 16/52* (2013.01); *C30B 25/10* (2013.01);
(Continued)

(58) Field of Classification Search
CPC ......... C30B 25/10; C30B 25/16; C30B 29/06; C23C 16/52; C23C 16/24; G01B 21/08;
(Continued)

(56) References Cited

U.S. PATENT DOCUMENTS

2022/0243323 A1 * 8/2022 Chandrasekharan ........................ C23C 16/4584
2022/0298672 A1 9/2022 M'Saad
(Continued)

FOREIGN PATENT DOCUMENTS

WO WO-2005062346 A1 * 7/2005 .......... H10P 72/0434

*Primary Examiner* — Robert M Kunemund
(74) *Attorney, Agent, or Firm* — Banner & Witcoff, Ltd.

(57) ABSTRACT

A semiconductor processing system includes a precursor delivery arrangement, a chamber arrangement, and a controller. The chamber arrangement is connected to the precursor delivery arrangement. The controller is operatively connected to the precursor delivery arrangement and the chamber arrangement, includes a processor disposed in communication with a memory, and is responsive to instructions recorded on the memory to acquire a baseline substrate thickness profile for a selected process recipe, determine a first temperature profile setting for depositing a first material layer at low pressure for the selected process recipe, determine a high-pressure thermal offset for the first temperature profile setting, apply the high-pressure thermal offset to the first temperature profile setting to determine a second temperature profile setting, seat a first substrate on the first substrate support within the chamber arrangement and flow a second material layer precursor via the precursor delivery arrangement over the first substrate at high pressure according to the selected process recipe using the second temperature profile setting.

24 Claims, 10 Drawing Sheets

(51) Int. Cl.

| | |
|---|---|
| ***C23C 16/52*** | (2006.01) |
| ***C30B 25/10*** | (2006.01) |
| ***C30B 29/06*** | (2006.01) |
| ***G01B 21/08*** | (2006.01) |
| ***H10P 14/20*** | (2026.01) |
| ***H10P 14/24*** | (2026.01) |

(52) U.S. Cl.
CPC .............. *C30B 29/06* (2013.01); *G01B 21/08* (2013.01); *H10P 14/24* (2026.01); *H10P 14/3411* (2026.01); *H10P 14/3442* (2026.01)

(58) Field of Classification Search
CPC ... H10P 14/3442; H10P 14/24; H10P 14/3411
See application file for complete search history.

(56) References Cited

U.S. PATENT DOCUMENTS

| | | | | |
|---|---|---|---|---|
| 2022/0301905 | A1 | 9/2022 | Ye | |
| 2022/0301906 | A1 | 9/2022 | Naik | |
| 2022/0327262 | A1* | 10/2022 | Kashyap | G06F 30/27 |
| 2023/0359179 | A1* | 11/2023 | Sanghvi | G05B 19/418 |

* cited by examiner

THERMAL MONITOR FOR HIGH PRESSURE PROCESSING

CROSS-REFERENCE TO RELATED APPLICATION(S)

This application claims the benefit of U.S. Provisional Application 63/477,713 filed on Dec. 29, 2022, the entire contents of which are incorporated herein by reference.

FIELD OF THE DISCLOSURE

The present disclosure relates generally to temperature control, and more particularly, to controlling substrate temperature during the deposition of material layers onto substrates during semiconductor device fabrication at high-pressure.

BACKGROUND OF THE DISCLOSURE

Material layers are commonly deposited onto substrates during the fabrication of semiconductor devices, such as during the fabrication of integrated circuits and power electronic devices. Deposition of such material layers is generally accomplished by supporting a substrate within a chamber arrangement, heating the substrate to a desired deposition temperature, and flowing one or more material layer precursors through the chamber arrangement and across the substrate. As the precursor flows across the substrate the material layer progressively develops onto the surface of the substrate according to temperature of the substrate, pressure and other environmental conditions within the chamber arrangement.

Various process parameters are carefully controlled to ensure the high quality of the deposited layers. One such critical parameter is the substrate temperature. During material layer deposition, the deposition gases react within prescribed temperature ranges for deposition onto the substrate. A change in temperature can result in a change in deposition rate and an undesirable layer thickness. Accordingly, it is important to accurately monitor and control the substrate temperature to maintain high-quality deposition.

Additionally, some deposition processes are performed at high pressure (e.g., above about 50 Torr). One such process is epitaxial growth of in-situ doped silicon phosphide (SiP) film for NMOS (N-type metal-oxide-semiconductor) fabrication. High pressure processes are often highly temperature and gas flow sensitive. Thus, depositing a uniform film requires proper thermal profile tuning, with subsequent gas flow tuning. This makes it important to understand and control the thermal uniformity profile across the wafer. Process uniformity tuning involves compensating temperature differences by adjusting gas flows and vice versa. Moreover, during high volume manufacturing (HVM) many chambers may need to be matched thermally first, followed by tuning of dopant concentrations making it necessary to have flow insensitive, highly temperature sensitive monitors. Conventional low-pressure thermal monitoring techniques, such as layer thickness monitoring or use of on-board thermocouples, are not suitable in a high-pressure environment. Both are temperature and flow sensitive and make it difficult or impossible to separate flow effects from thermal effects. Many factors can impact the accuracy of thermocouple temperature measurements as well. For example, the substrate responds much faster to thermal changes during processing than the thermocouples because the substrate undergoes relatively fast radiant heating, the thermocouple depends on slower convection heating from the substrate to read the substrate temperature. In some processing arrangements there is a gap between the substrate and the thermocouple. For deposition and growth processes at high pressure, the thermal conductivity of gas present within the gap may change with gas flow impacting accuracy of thermocouple readings as well. Furthermore, at high-pressure certain epitaxial growth rates can be higher than at low pressure leading to challenges in accurately measuring thickness using the spectroscopic ellipsometry.

Such systems have generally been accepted for their intended purpose. However, there remains a need for improved thermal profile monitoring for high-pressure substrate processing systems that is sensitive to temperature and insensitive to flow. The present disclosure provides a solution to this need.

SUMMARY OF THE DISCLOSURE

A material layer deposition method is provided. The method includes, at a chamber arrangement including a chamber body, a first substrate support arranged within an interior of the chamber body, an upper heater element array supported above an upper wall of the chamber body, and a lower heater element array supported below a lower wall of the chamber body, acquiring a baseline substrate thickness profile for a selected process recipe, determining a first temperature profile setting at a low pressure for deposition of a first material layer of the selected process recipe, determining a high-pressure thermal offset for the first temperature profile setting, applying the high-pressure thermal offset to the first temperature profile setting to determine a second temperature profile setting, seating a first substrate on the first substrate support and depositing a second material layer over the first substrate at a high pressure based on the selected process recipe using the second temperature profile setting.

In addition to one or more of the features described above, or as an alternative, further examples may include that determining the first temperature profile setting further comprises seating a second substrate on a second substrate support, processing the second substrate according to the selected process recipe including flowing a first material layer precursor at the low pressure to deposit a first material layer onto the second substrate, measuring a second substrate thickness profile, and matching the second substrate thickness profile to the baseline substrate thickness profile to determine the first temperature profile setting.

In addition to one or more of the features described above, or as an alternative, further examples may include that matching the second substrate thickness profile further comprises determining if the second substrate thickness profile is within a threshold margin of the baseline substrate thickness profile. The method may include that determining the high-pressure thermal offset for the first temperature profile setting further comprises modifying the selected process recipe to remove one or more precursors. In some examples, the high-pressure thermal offset may be based on at least a first temperature of a third substrate at the low pressure and a least a second temperature of the third substrate at the high pressure. The method may include that determining the high-pressure thermal offset further comprises seating a third substrate on a third substrate support, processing the third substrate according to the modified selected process recipe at the low pressure, acquiring a first temperature differential between a center portion of the third substrate and an outer circumferential edge portion of the third substrate at the low pressure, processing the third substrate according to the modified selected process recipe at the high pressure, acquiring a second temperature differential between the center portion of the third substrate and the outer circumferential edge portion of the third substrate at the high pressure, and determining a difference between the first temperature differential and the second temperature differential to determine the high-pressure thermal offset. The first substrate support, the second substrate support and/or the third substrate support may be the same. In an example, the modified selected process recipe may be hydrogen ($H_2$).

In addition to one or more of the features described above, or as an alternative, further examples may include that depositing the second material layer over the first substrate at the high pressure according to the selected process recipe using the second temperature profile setting, further comprises modifying power to adjust heat output by one or more heating elements, based on the second temperature profile setting, flowing precursor according to the selected process recipe to deposit the second material layer on the first substrate at the high pressure using the second temperature profile setting, subsequent to modifying power, and determining if a first substrate thickness profile matches the baseline substrate thickness profile within a threshold margin.

In addition to one or more of the features described above, or as an alternative, further examples may include that depositing the second material layer over the first substrate at the high pressure according to the selected process recipe using the second temperature profile setting further comprises adjusting a gas flow setting so as to match the first substrate thickness profile to the baseline substrate thickness profile within a threshold margin. The selected process recipe may be for epitaxial growth of a phosphorous-doped silicon (SiP) material layer. In an example, the low pressure may be between about 0.1 Torr and about 50 Torr and the high pressure may be between about 200 Torr and about 400 Torr.

In addition to one or more of the features described above, or as an alternative, further examples may include that applying the high-pressure thermal offset to the first temperature profile setting comprises adjusting a target temperature threshold of the first temperature profile setting based on the high-pressure thermal offset.

A semiconductor processing system is provided. The semiconductor processing system includes a precursor delivery arrangement, a chamber arrangement as described above connected to the precursor delivery arrangement and a controller operatively connected to the precursor delivery arrangement and the chamber arrangement. The controller including a processor disposed in communication with a memory and responsive to instructions recorded on the memory may, acquire a baseline substrate thickness profile for a selected process recipe, determine a first temperature profile setting for depositing a first material layer at a low pressure for the selected process recipe, determine a high-pressure thermal offset for the first temperature profile setting, apply the high-pressure thermal offset to the first temperature profile setting to determine a second temperature profile setting, seat a first substrate on a first substrate support within the chamber arrangement and flow a second material layer precursor via the precursor delivery arrangement over the first substrate at a high pressure according to the selected process recipe using the second temperature profile setting.

In addition to one or more of the features described above, or as an alternative, further examples may include that to apply the high-pressure thermal offset to the first temperature profile setting, the instructions further cause the controller to adjust a target temperature threshold of the first temperature profile setting based on the high-pressure thermal offset.

In addition to one or more of the features described above, or as an alternative, further examples may include that the instructions further cause the controller to modify a power setting to adjust heat output by one or more heating elements, based on the second temperature profile setting, adjust a gas flow setting so as to match a first substrate thickness profile to the baseline substrate thickness profile within a threshold margin and flow precursor according to the selected process recipe to deposit one or more material layers on the first substrate at the high pressure using the second temperature profile setting, subsequent to modifying the power setting and adjusting the gas flow setting.

In addition to one or more of the features described above, or as an alternative, further examples may include that to determine the first temperature profile setting the instructions further cause the controller to seat a second substrate on a second substrate support, process the second substrate according to the selected process recipe including flowing a first material layer precursor at the low pressure, measure a thickness profile across the second substrate and match the second substrate thickness profile to the baseline substrate thickness profile to determine the first temperature profile setting.

In addition to one or more of the features described above, or as an alternative, further examples may include that to match the second substrate thickness profile the instructions further cause the controller to determine if the second substrate thickness profile is within a threshold margin of the baseline substrate thickness profile. In addition to one or more of the features described above, or as an alternative, further examples may include that the instructions further cause the controller to modify the selected process recipe to remove one or more precursors.

In addition to one or more of the features described above, or as an alternative, further examples may include that to determine the high-pressure thermal offset the instructions further cause the controller to compare at least a first temperature of a third substrate at the low pressure and at least a second temperature of the third substrate at the high pressure.

In addition to one or more of the features described above, or as an alternative, further examples may include that to determine the high-pressure thermal offset the instructions further cause the controller to seat a third substrate on a third substrate support, process the third substrate according to the modified selected process recipe at the low pressure, acquire a first temperature differential between a center portion of the third substrate and an outer circumferential edge portion of the third substrate at the low pressure, process the third substrate according to the modified selected process recipe at the high pressure, acquire a second temperature differential between the center portion of the third substrate and the outer circumferential edge portion of the third substrate at the high pressure and determine the high-pressure thermal offset by determining a difference between the first temperature differential and the second temperature differential. In an example, the first substrate support, the second substrate support and/or the third substrate support may be the same.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
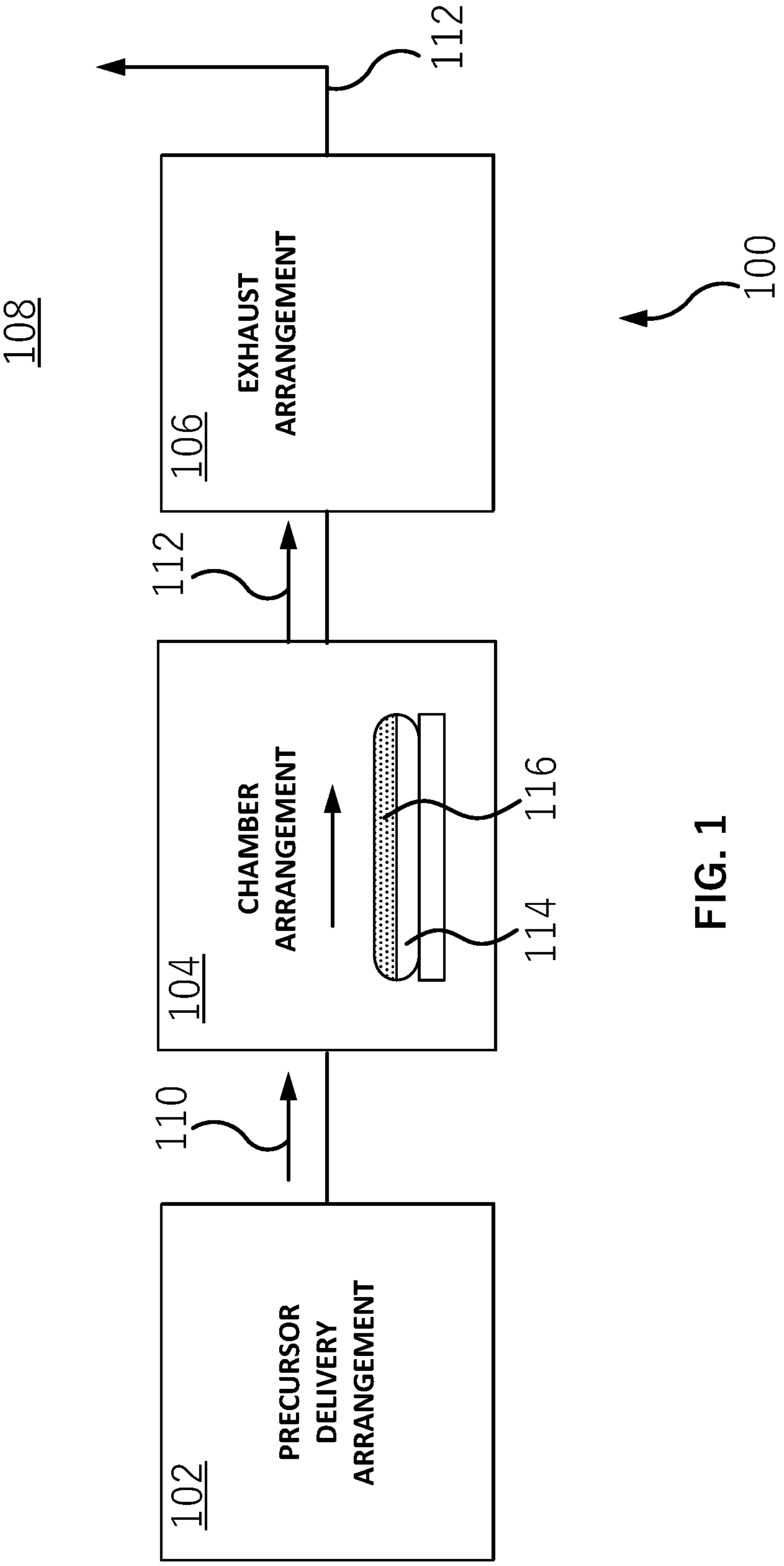
FIG. 1 is a schematic diagram illustrating an example a semiconductor processing system.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationships or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

As used herein, the term "substrate" may refer to any underlying material or materials that may be used, or upon which, a device, a circuit, or a film may be formed. The "substrate" may be continuous or non-continuous, rigid, flexible, solid or porous. Substrates in the form of a plate may include wafers, e.g., 300-millimeter silicon wafers, in various shapes and sizes. Substrates may be made from materials such as silicon, silicon germanium, silicon oxide, gallium arsenide, gallium nitride and silicon carbide by way of non-limiting example. A continuous substrate may extend beyond the bounds of a process chamber where a deposition process occurs and may move through the process chamber such that the process continues until the end of the substrate is reached. A continuous substrate may be supplied from a continuous substrate feeding system, enabling manufacture and output of the continuous substrate in any appropriate form.

Reference will now be made to the drawings wherein like reference numerals identify similar structural features or aspects of the subject disclosure. For purposes of explanation and illustration, and not limitation, a partial view of an example of a chamber arrangement in accordance with the present disclosure is shown in FIG. 1 and is designated generally by reference character 100. Other examples of chamber arrangements, semiconductor processing systems, and methods of depositing material layers onto substrates in accordance with the present disclosure, or aspects thereof, are provided in FIGS. 2-6, as will be described. The systems and methods of the present disclosure can be used for thermal profile monitoring during the deposition of material layers onto substrates, such as during the deposition of epitaxial material layers onto substrates during the fabrication of semiconductor devices at high pressure, though the present disclosure is not limited to epitaxial material layers or to the fabrication of any particular type of semiconductor device.

With reference to FIG. 1, a semiconductor processing system 100 is shown. The semiconductor processing system 100 includes a precursor delivery arrangement 102, the chamber arrangement 104, and an exhaust arrangement 106. The precursor delivery arrangement 102 is connected to the chamber arrangement 104 and is configured to provide a precursor 110 to the chamber arrangement 104. The chamber arrangement 104 is connected to the exhaust arrangement 106 and is configured to deposit a material layer 116 onto a substrate 114 supported within the chamber arrangement 104 using the precursor 110. The exhaust arrangement 106 is in fluid communication with the environment 108 external to the semiconductor processing system 100 and is configured to communicate a flow of residual precursor and/or reaction products 112 to the environment 108 external to the semiconductor processing system 100. Semiconductor processing system 100 may be configured for high-pressure processing of substrate 114 such as for epitaxial growth of in-situ doped silicon phosphide (SiP) film for NMOS fabrication. In an example, semiconductor processing system 100 may be operable for use in a variety of other high-pressure semiconductor processing techniques such as other epitaxial growth processes using chemical vapor deposition (CVD) or atomic layer deposition (ALD) techniques. An additional high pressure processing technique is high-pressure selective silicon epitaxial growth at temperature lower than 650 C.

Figure 2:
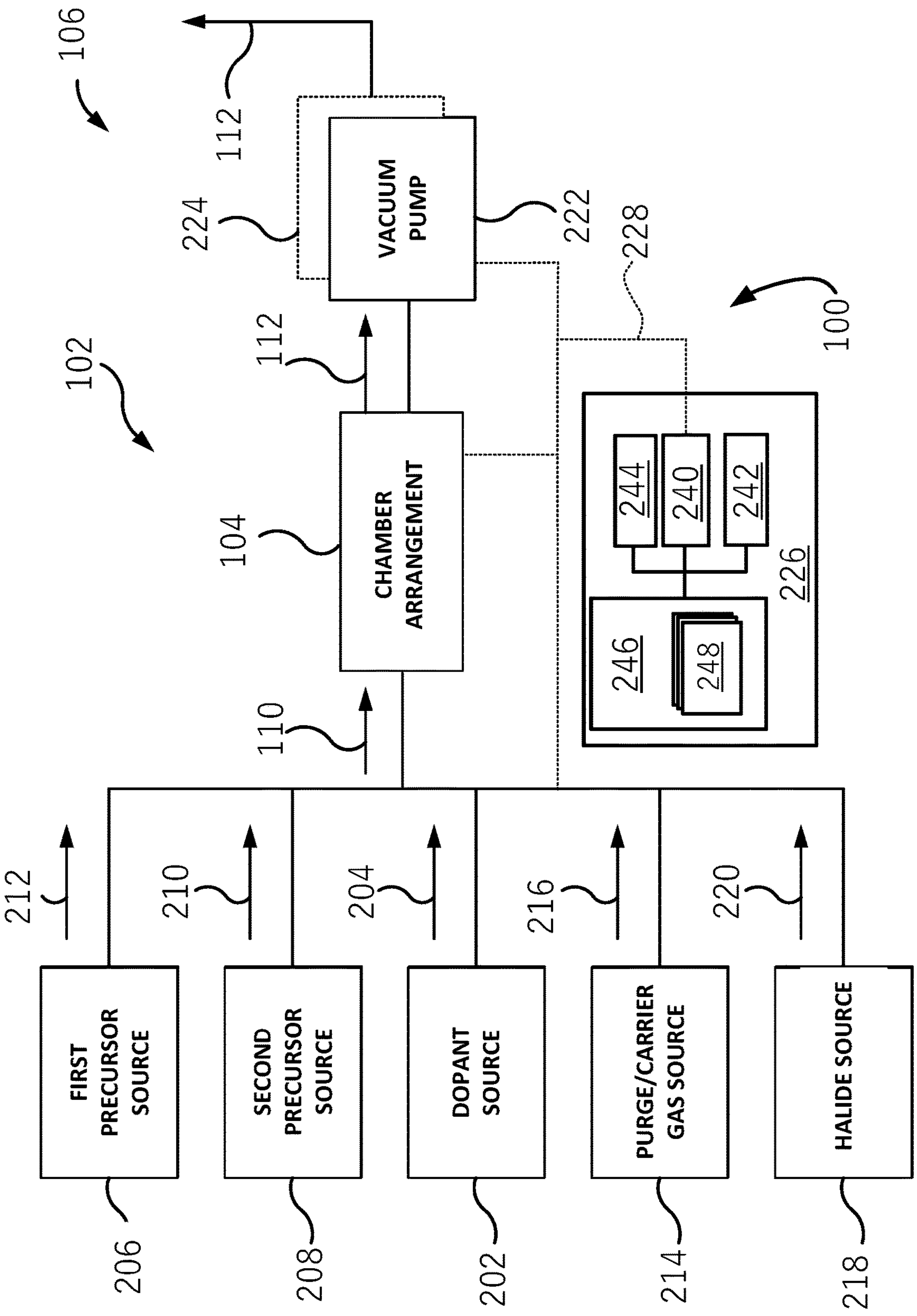
FIG. 2 is a schematic diagram illustrating an example precursor delivery arrangement and exhaust arrangement.

With reference to FIG. 2, the precursor delivery arrangement 102, chamber arrangement and the exhaust arrangement 106 are shown. The precursor delivery arrangement 102 includes a first precursor source 206, a second precursor source 208, and a dopant source 202. The precursor delivery arrangement 102 also includes a purge/carrier gas source 214 and a halide source 218. The first precursor source 206 is connected to the chamber arrangement 104, includes a silicon-containing precursor 212, and is configured to provide a flow of the silicon-containing precursor 212 to the chamber arrangement 104. Non-limiting examples of suitable silicon-containing precursors include dichlorosilane ($H_2SiCl_2$) and trichlorosilane ($HCl_3Si$), and non-chlorinated silicon-containing precursors, such as silane ($SiH_4$), disilane ($Si_2H_6$), tert-butylarsine ($C_4H_9As$), monomethyl silane ($CH_3SiH_3$), and/or trisilane ($Si_3H_8$).

In an example, the second precursor source 208 is connected to the chamber arrangement 104, may include a germanium-containing precursor 210, and is configured to provide a flow of the germanium-containing precursor 210 to the chamber arrangement 104. Examples of suitable germanium-containing precursors include germane ($GeH_4$). The dopant source 202 is similarly connected to the chamber arrangement 104, includes a dopant-containing precursor 204, and is further configured to provide a flow to the dopant-containing precursor 204 to the chamber arrangement 104. In certain examples the dopant-containing precursor 204 may include phosphorous (P), phosphine ($PH_3$), arsine ($AsH_3$), diborane ($B_2H_6$), and/or phosphorus trichloride ($PCl_3$). It is also contemplated that the dopant-containing precursor 204 may include different or additional species and remain within the scope of the present disclosure.

In an example, the purge/carrier gas source 214 is further connected to the chamber arrangement 104, includes a purge/carrier gas 216, and is additionally configured to provide a flow of the purge/carrier gas 216 to the chamber arrangement 104. In this respect the purge/carrier gas source 214 may be configured to employ the purge/carrier gas 216 to carry one or more of the silicon-containing precursor 212, the germanium-containing precursor 210, and/or the dopant-containing precursor 204 into the chamber arrangement 104. Examples of suitable purge/carrier gases include hydrogen ($H_2$) gas, nitrogen ($N_2$) gas, inert gases such as argon (Ar) gas or helium (He) gas, and mixtures thereof.

In an example, the halide source 218 is connected to the chamber arrangement 104, includes a halide-containing material 220, and is configured to provide a flow of the halide-containing material 220 to the chamber arrangement 104. The halide-containing material 220 may be co-flowed with the precursor 110. The halide-containing material 220 may be flowed independently from the precursor 110, such as to provide a purge and/or to remove condensate from within the chamber arrangement 104. Examples of suitable halides include chlorine (Cl), e.g., chlorine ($Cl_2$) gas, dichlorosilane ($H_2SiCl_2$), trichlorosilane ($H_2SiCl_2$) and hydrochloric (HCl) acid, as well as fluorine (F), e.g., fluorine ($F_2$) gas and hydrofluoric (HF) acid.

In an example, the exhaust arrangement 106 is configured to evacuate the chamber arrangement 104 and in this respect may include one or more vacuum pump 222 and/or an abatement apparatus 224. The one or more vacuum pump 222 may be connected to the chamber arrangement 104 and configured to control pressure within the chamber arrangement 104. The abatement apparatus 224 may be connected to the one or more vacuum pump 222 and configured to process the flow a residual precursor and/or reaction products 112 issued by the chamber arrangement 104. It is contemplated that the exhaust arrangement 106 may be configured to maintain environmental conditions within the chamber arrangement 104 suitable for atmospheric deposition operations, such as pressures between about 50 Torr and about 800 Torr, such as during high-pressure deposition of epitaxial material layers including SiP. The exhaust arrangement 106 may also be configured to maintain environmental conditions within the exhaust arrangement 106 suitable for reduced pressure deposition operations, such as pressures between about .1 Torr and about 50 Torr, such as during the deposition of epitaxial material layers including using reduced pressure techniques.

In an example, the precursor delivery arrangement 102, chamber arrangement and/or the exhaust arrangement 106, may be operatively coupled to a system operation and control mechanism, controller 226. Controller 226 may provide electronic circuitry and mechanical components to selectively operate valves, manifolds, pumps and other equipment included in semiconductor processing system 100. Such circuitry and components operate to introduce precursors 210 and 212 and/or purge/carrier gasses 216 from the respective precursor sources 206, 208 and purge gas source 214. The controller 226 also controls timing of gas pulse sequences, temperature of the substrate and reaction chamber, and pressure of the reaction chamber and various other operations necessary to provide proper operation of the semiconductor processing system 100. Controller 226 can include control software and electrically or pneumatically controlled valves to control flow of precursors, reactants and purge gasses into and out of the reaction chamber 104. Controller 226 includes a device interface 240, a processor 244, a user interface 242, and a memory 246. The device interface 240 connects the processor 244 to the wired or wireless link 228. The processor 244 is operably connected to the user interface 242 (e.g., to receive user input and/or provide user output therethrough) and is disposed in communication with the memory 246. The memory 246 includes a non-transitory machine-readable medium having one or more program modules 248 recorded thereon containing instructions that, when read by the processor 244, cause the processor 244 to execute certain operations responsive to the instructions. Program modules 248 may comprise software, firmware and/or hardware components, e.g., a FPGA or ASIC, configured to performs certain tasks. Among the operations are operations of a material layer deposition method 500 (shown in FIGS. 5A-5F), as will be described. As will be appreciated by those of skill in the art in view of the present disclosure, the controller 226 may have a different arrangement in other examples and remain within the scope of the present disclosure.

Figure 3:
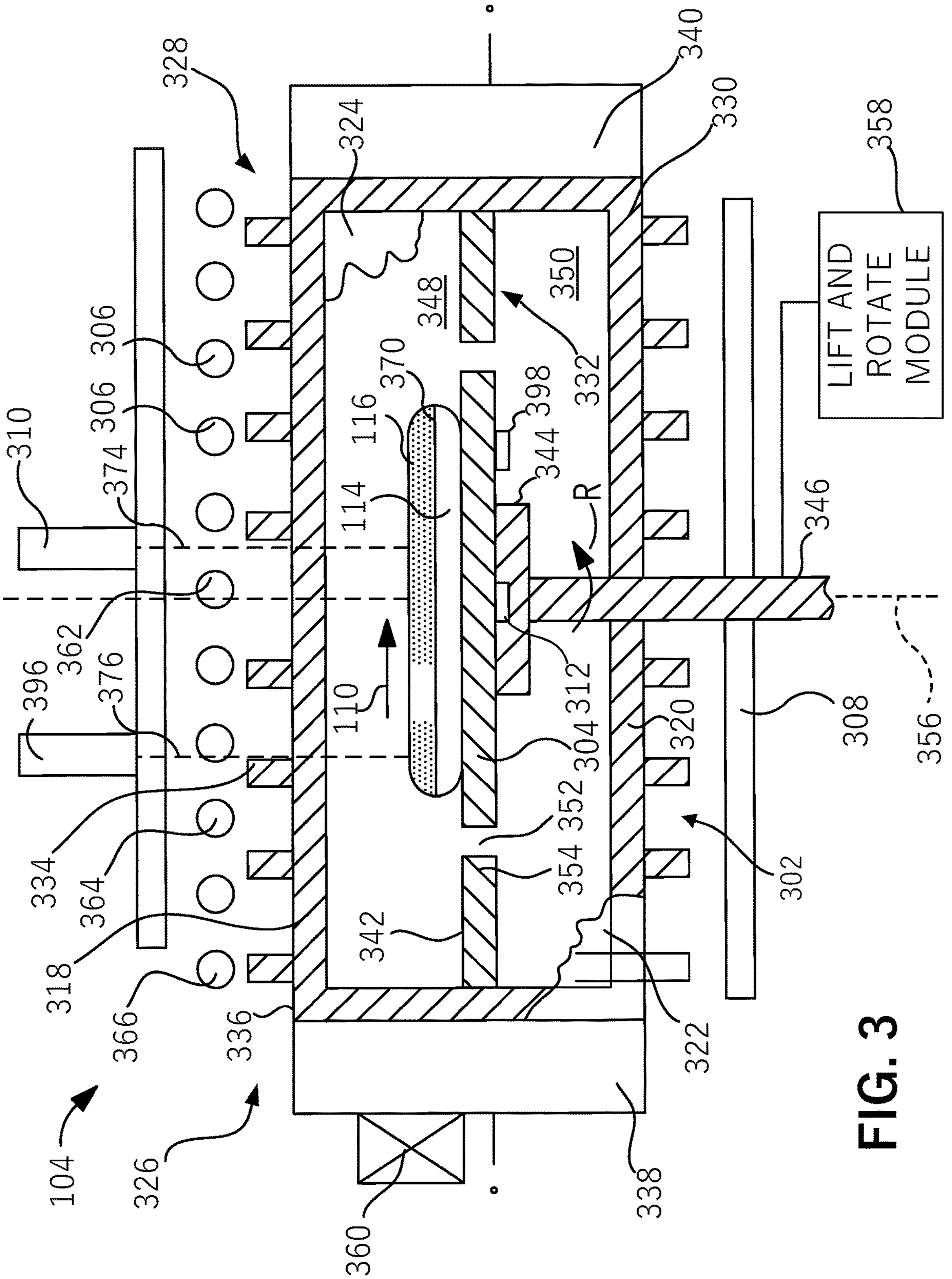
FIG. 3 is a schematic diagram illustrating an example semiconductor processing chamber arrangement.

With reference to FIG. 3, the chamber arrangement 104 is shown. The chamber arrangement 104 includes a chamber body 302 and a substrate support 304 arranged within an interior 332 of the chamber body 302. The chamber arrangement 104 also includes an upper heater element array 306 and a lower heater element array 308. The chamber arrangement 104 further includes pyrometers 310 and 396, thermocouples 312 and 398, a controller 226 (shown in FIG. 4), and a wired or wireless link 228 (shown in FIG. 4). Although a specific arrangement is shown and described herein it is to be understood and appreciated that the chamber arrangement 104 may include other elements and/or omit elements shown and described herein and remain within the scope of the present disclosure.

In an example, the chamber body 302 is configured to flow the precursor 110 across the substrate 114 and has an upper wall 318, a lower wall 320, a first sidewall 322, and a second sidewall 324. The upper wall 318 extends longitudinally between an injection end 326 and a longitudinally opposite exhaust end 328 of the chamber body 302, is supported horizontally relative to gravity, and is formed from a transmissive material 330. The lower wall 320 is below and parallel relative to the upper wall 318 of the chamber body 302, is spaced apart from the upper wall 318 by an interior 332 of the chamber body 302 and is also formed from the transmissive material 330. The first sidewall 322 longitudinally spans the injection end 326 and the exhaust end 328 of the chamber body 302, extends vertically between the upper wall 318 and the lower wall 320 of the chamber body 302, and is formed from the transmissive material 330. The second sidewall 324 is parallel to the first sidewall 322, is laterally opposite and spaced apart from the first sidewall 322 by the interior 332 of the chamber body 302 and is further formed from the transmissive material 330. In certain examples, the transmissive material 330 may include a ceramic material such as sapphire or quartz. In accordance with certain examples, the chamber body 302 may include a plurality of external ribs 334. The plurality of external ribs 334 may extend laterally about an exterior 336 of the chamber body 302 and be longitudinally spaced between the injection end 326 and the exhaust end 328 of the chamber body 302. In certain examples, the one or more of the walls 318-324 may be substantially planar. In accordance with certain examples, one or more of the walls 318-324 may be arcuate or dome-like in shape. It is also contemplated that, in accordance with certain examples, the chamber body 302 may include no ribs.

In an example, an injection flange 338 and an exhaust flange 340 may be connected to the injection end 326 and the exhaust end 328, respectively, of the chamber body 302. The injection flange 338 may fluidly couple the precursor delivery arrangement 102 (shown in FIG. 1) to the interior 332 of the chamber body 302 and be configured to provide the precursor 110 to the interior 332 of the chamber body 302. The exhaust flange 340 may fluidly couple the interior 332 of the chamber body 302 to the exhaust arrangement 106. The exhaust flange 340 may be configured to communicate the residual precursor and/or reaction products 112 (shown in FIG. 1) issued by the chamber arrangement 104 during deposition of the material layer 116 onto the substrate 114. In this respect the chamber body 302 may have a cold wall, cross-flow reactor configuration.

In an example, a divider 342, a support member 344, and a shaft member 346 may be arranged within the interior 332 of the chamber body 302. The divider 342 may be fixed within the interior 332 of the chamber body 302 and divide the interior 332 of the chamber body 302 into an upper chamber 348 and a lower chamber 350. The divider 342 may further define an aperture 352 therethrough, the aperture 352 fluidly coupling the upper chamber 348 of the chamber body 302 to the lower chamber 350 of the chamber body 302. The divider 342 may be formed from an opaque material 354. The opaque material 354 may include silicon carbide.

In an example, the substrate support 304 may be configured to seat thereon the substrate 114 and supported at least partially within the aperture 352 for rotation R about a rotation axis 356. The substrate support 304 may seat the substrate 114 such that a radially-outer peripheral of the substrate 114 abuts the substrate support 304 while a radially-inner central portion of the substrate 114 is spaced apart from the substrate support 304. The support member 344 may be arranged below the substrate support 304 and along the rotation axis 356. The support member 344 may be further arranged within the lower chamber 350 of the chamber body 302 and fixed in rotation relative to the substrate support 304 about the rotation axis 356 for rotation with the substrate support 304. The substrate support 304 may be formed from an opaque material, such as the opaque material 354 or a graphite material. The support member 344 may be formed from a transmissive material, such as the transmissive material 330.

In an example, the shaft member 346 may be arranged along the rotation axis 356 and fixed in rotation relative to the support member 344 about the rotation axis 356. The shaft member 346 may also extend through the lower chamber 350 of the chamber body 302 and through lower wall 320 of chamber body 302. The shaft member 346 may further operably connect a lift and rotate module 358 to the substrate support 304, the lift and rotate module 358 in turn may be configured to rotate R the substrate support 304 and the substrate 114 about the rotation axis 356 during deposition of the material layer 116 onto an upper surface 370 of the substrate 114. The lift and rotate module 358 may further cooperate with a gate valve 360 and a lift pin arrangement to seat and unseat the substrate 114 from the substrate support 304, such as through a substrate handling robot arranged within a cluster-type platform in selective communication with the interior 332 of the chamber body 302 through the gate valve 360. In certain examples the shaft member 346 may be formed from a transmissive material, such as the transmissive material 330.

Figure 4:
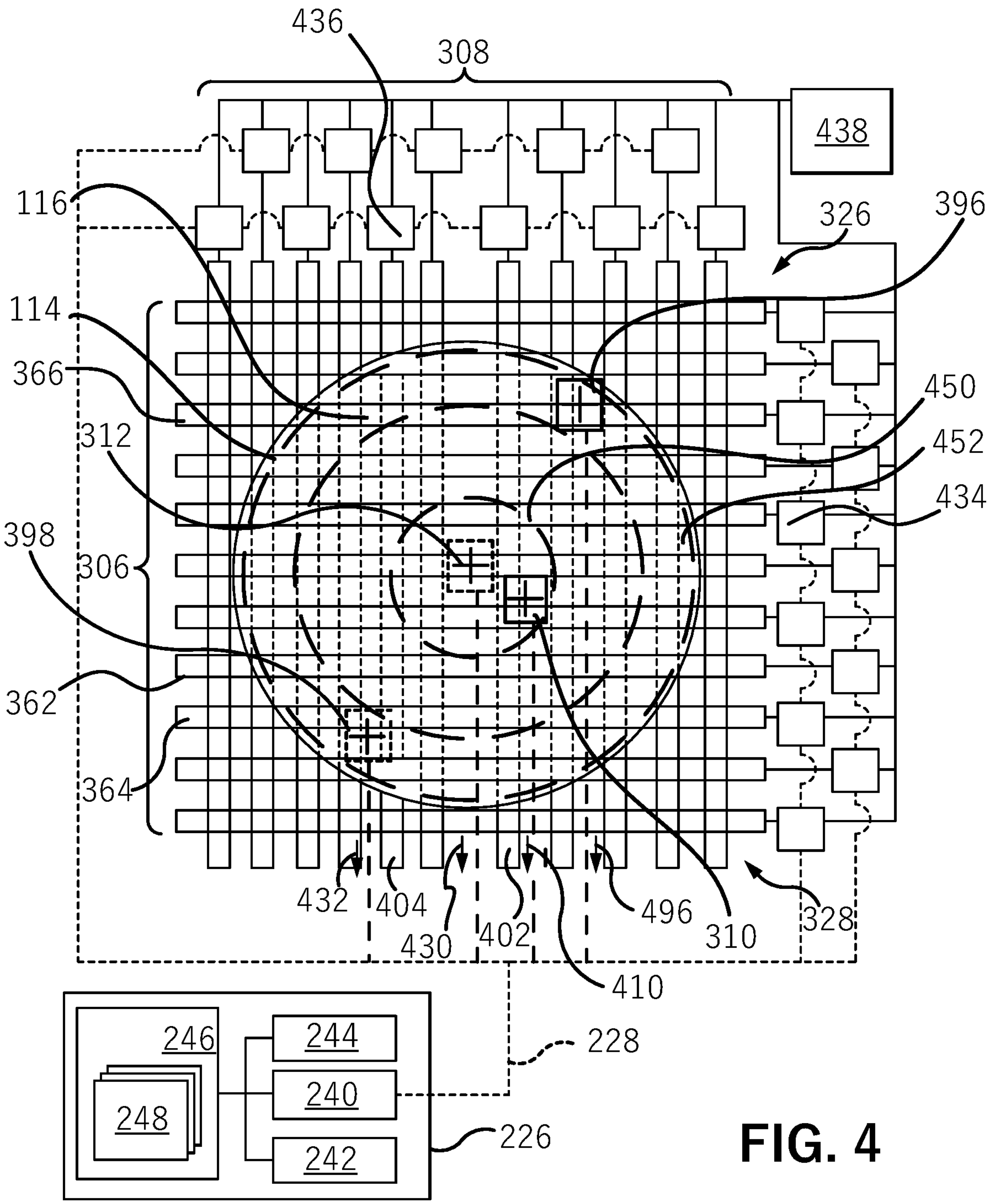
FIG. 4 is a schematic diagram illustrating an example heat arrangement of the semiconductor processing chamber arrangement shown in FIG. 3.

FIG. 4 is a schematic diagram illustrating an example heat arrangement including upper heater element array 306 and lower heater element array 308. The upper heater element array 306 is configured to heat the substrate 114 and/or the material layer 116 during deposition onto the substrate 114 by radiantly communicating heat into the upper chamber 348 (see FIG. 3) of the chamber body 302. In this respect the upper heater element array 306 may include a first upper heater element 362, a second upper heater element 364, and at least one third upper heater element 366. The first upper heater element 362 may include a linear filament and a quartz tube enclosing the linear filament and/or may include one or more bulb or lamp-type heater elements. The first upper heater element 362 may be supported above the upper wall 318 of the chamber body 302, extend laterally between the first sidewall 322 and the second sidewall 324 of the chamber body 302, and may further overlay the substrate support 304. The second upper heater element 364 and the at least one third upper heater element 366 may be similar to the first upper heater element 362, may additionally be longitudinally spaced apart from the first upper heater element 362, and may further be longitudinally spaced apart from the rotation axis 356. The second upper heater element 364 may further overlay (e.g., intersect) a peripheral edge of the substrate 114. The at least one third upper heater element 366 may overlay the divider 342. In certain examples, the upper heater element array 306 may include eleven (11) or twelve (12) upper heater elements. Each upper heater element of the upper heater element array 306 may be longitudinally spaced apart from one another above the upper wall 318 of the chamber body 302 between the injection end 326 and the exhaust end 328 of the chamber body 302.

In an example, the lower heater element array 308 is similar to the upper heater element array 306 both configured to heat the substrate 114 (shown in FIG. 3) and/or the material layer 116 (shown in FIG. 3) during deposition onto the substrate 114. In this respect the lower heater element array 308 may be configured to communicate radiant heat into the lower chamber 350 (shown in FIG. 3) of the chamber body 302 (shown in FIG. 3) to the substrate support 304 (shown in FIG. 3) and the divider 342 (shown in FIG. 3). The substrate support 304 and the divider 342 may in turn heat the substrate 114 by conducting the heat through the bulk material forming the substrate support 304 and the divider 342, radiant heat communicated into the lower chamber 350 by the lower heater element array 308 thereby being conducted to the substrate 114. The lower heater element array 308 may include a first lower heater element 402 and at least one second lower heater element 404.

In an example, the first lower heater element 402 is similar to the first upper heater element 362 and is additionally supported below the lower wall 320 (shown in FIG. 3) of the chamber body 302 (shown in FIG. 3). The first lower heater element 402 further extends longitudinally between the injection end 326 and the exhaust end 328 of the chamber body 302. The first lower heater element 402 may further be substantially orthogonal relative to the first upper heater element 362 of the upper heater element array 306. The at least one second lower heater element 404 may be parallel to the first lower heater element 402 and laterally spaced apart from the first lower heater element 402 below the lower wall 320 (shown in FIG. 3) of the chamber body 302. In certain examples, the first lower heater element 402 may underlie the substrate support 304. In accordance with certain examples, the at least one second lower heater element 404 may underlie the divider 342 (shown in FIG. 3). It is also contemplated that, in accordance with certain examples, the lower heater element array 308 may include eleven (11) or twelve (12) lower heater elements each laterally spaced apart from one another below the lower wall 320 of the chamber body 302.

In an example, pyrometers 310 and 396 are configured to acquire an optical temperature measurement 410 using electromagnetic radiation emitted by the substrate 114 and/or the material layer 116. Pyrometers 310 and 396 are supported above the upper wall 318 (shown in FIG. 3) of the chamber body 302 (shown in FIG. 3) and are arranged along respective optical axes 374 and 376 (shown in FIG. 3). More specifically, pyrometers 310 and 396 are supported above the upper heater element array 306 and arranged longitudinally between the injection end 326 and the exhaust end 328 of the chamber body 302 such that the optical axes 374 and 376 may extend between the first upper heater element 362 and the second upper heater element 364. The optical axes 374 and 376 may further intersect the substrate support 304. The optical axes 374 and 376 may intersect the substrate 114 when seated on the substrate support 304. Pyrometer 310 is positioned to take temperature readings at a center portion 450 of substrate 114 along optical axis 374 while pyrometer 396 is positioned to take temperature readings at a circumferential edge portion 452 of substrate 114 along optical axis 376. The optical temperature measurement 410 may be acquired directly from the upper surface 370 of the substrate 114 and/or the material layer 116 during or after processing, calibration or deposition onto the substrate 114 by pyrometer 310. Likewise, optical temperature measurement 496 may be acquired directly from the upper surface 370 of the substrate 114 and/or the material layer 116 during or after processing, calibration or deposition onto the substrate 114 by pyrometer 396. In certain examples, the optical axis 374 and/or the optical axis 376 may be coaxial with the rotation axis 356. In accordance with certain examples, one or more pyrometers 310 and 396 may be at least one of longitudinally offset and/or laterally offset from the rotation axis 356, e.g., radially offset from the rotation axis 356. As will be appreciated by those of skill in the art in view of the present disclosure, offsetting the optical axis 374 and/or optical axis 376 from the rotation axis 356 may facilitate packaging of one or more pyrometers 310 and 396 above the chamber body 302. Examples of suitable pyrometers include OR400M optical infrared pyrometers, available from the Advanced Energy Corporation of Denver, Colorado.

In an example, thermocouples 312 and 398 may be configured to acquire temperature of the substrate support 304 and provide respective contact temperature measurements 430 and 432 indicative of temperature of the substrate support 304. In this respect the thermocouples 312 and 398 may be arranged within the interior 332 (shown in FIG. 3) of the chamber body 302 (shown in FIG. 3). More specifically, thermocouples 312 and 398 may be arranged within the lower chamber 350 (shown in FIG. 3) of the chamber body 302 and fixed in rotation R relative to the substrate support 304. In some examples, thermocouples 312 and 398 may be in intimate mechanical contact (e.g., abut) contact with a lower surface of the substrate support 304. Thermocouples 312 and 398 may be in close proximity to lower surface of the substrate 114, in some cases with a small gap between a measurement surface of the thermocouple and the underside surface of the substrate. The thermocouple 312 may be arranged along the rotation axis 356 and disposed proximate center portion 450. The thermocouple 398 may be offset from the rotation axis 356, for example radially offset from the rotation axis 356 and disposed about circumferential edge portion 452. Examples of suitable thermocouples includes those shown and described in U.S. Pat. No. 7,874,726 B2 to Jacobs et al, issued Jan. 25, 2011, the contents of which is incorporated herein by reference in its entirety.

In an example, the controller 226 is connected to the upper heater element array 306 and the lower heater element array 308. In this respect the wired or wireless link 228 may connect the controller 226 to the upper heater element array 306 and the lower heater element array 308. In certain examples one or more upper silicon-controlled rectifier (SCR) devices 434 may couple the controller 226 to the upper heater element array 106. In accordance with certain examples, a singular one of the one or more upper SCR device 434 couple each of the upper heater elements of the upper heater element array 306 to both the controller 226 and a power source 438, the controller 226 thereby having discrete control over power applied to each of the upper heater elements of the upper heater element array 306. The lower heater element array 308 may be similarly controlled, one or more lower SCR device 436 coupling the controller 226 to the lower heater elements of the lower heater element array 308. The one or more lower SCR devices 436 may include a singular lower SCR device coupling each of the lower heater elements of the lower heater element array 308 to both the controller 226 and the power source 438 to provide discrete control over power applied to each of the lower heater elements of the lower heater element array 308.

As will be appreciated by those of skill in the art in view of the present disclosure, controller 226 may control heat output of the upper heater element array 306 and output of the lower heater element array 308 according to process settings acquired by process 500 described in greater detail with respect to FIGS. 5A-5F.

In semiconductor manufacturing, substrate process refining can be performed by tuning a variety of parameters impacting uniformity and thickness of a final substrate product. In an example, substrate temperatures may be fine-tuned by adjusting power to individually addressable SCRs that regulate thermal output of respective lamps controlled by the individually addressable SCRs (as described above with respect to FIG. 4). SCR tuning may change the thickness profile of a substrate by changing the thermal profile across the substrate. Additionally, the mass flow controller (MFC) may be tuned to change the gas flow of each precursor. Further, automatic gas injection (AGI) tuning may change the distribution of gas flow with respect to the substrate. However, to tune precisely the technician must be able to separate thermal effects from flow effects. Thermal and flow effects may be convoluted under certain process conditions, such as, for example under high pressure deposition of SiP. Process 500 describes an approach for separating thermal effects from flow effects to enable tuning of each in a high-pressure process.

Figure 5A:
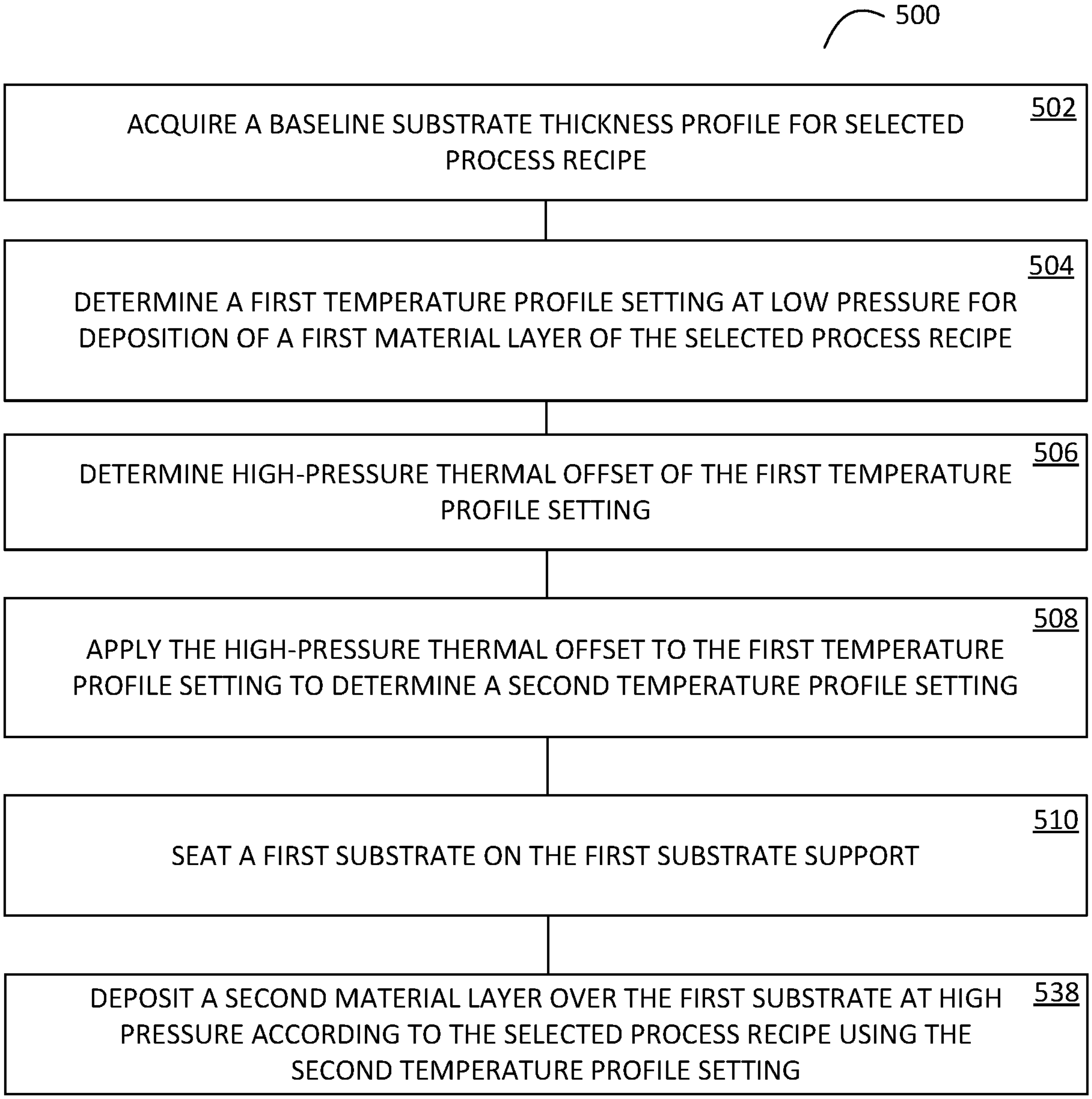
FIGS. 5A-5F are flow charts illustrating examples of various operations of a material layer deposition process.
Figure 5B:
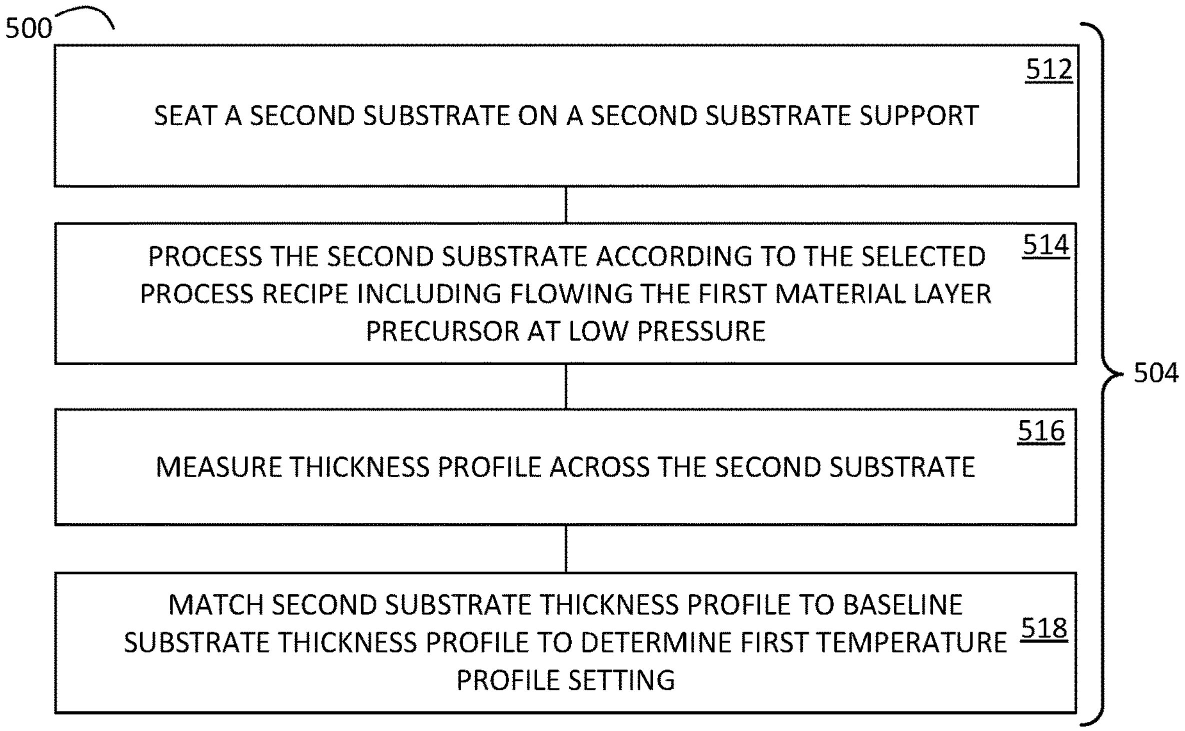
Figure 5C:
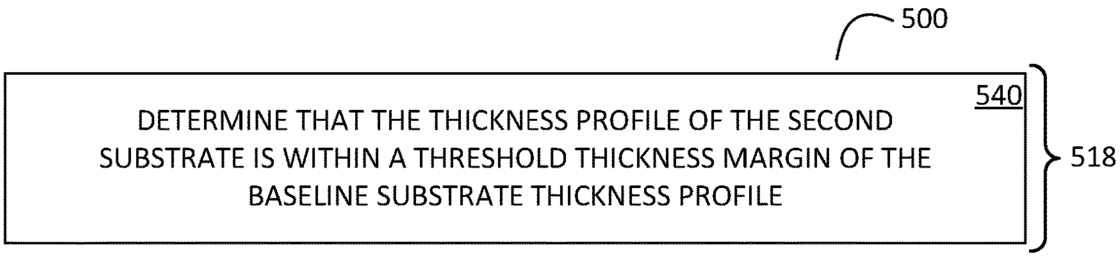
Figure 5D:
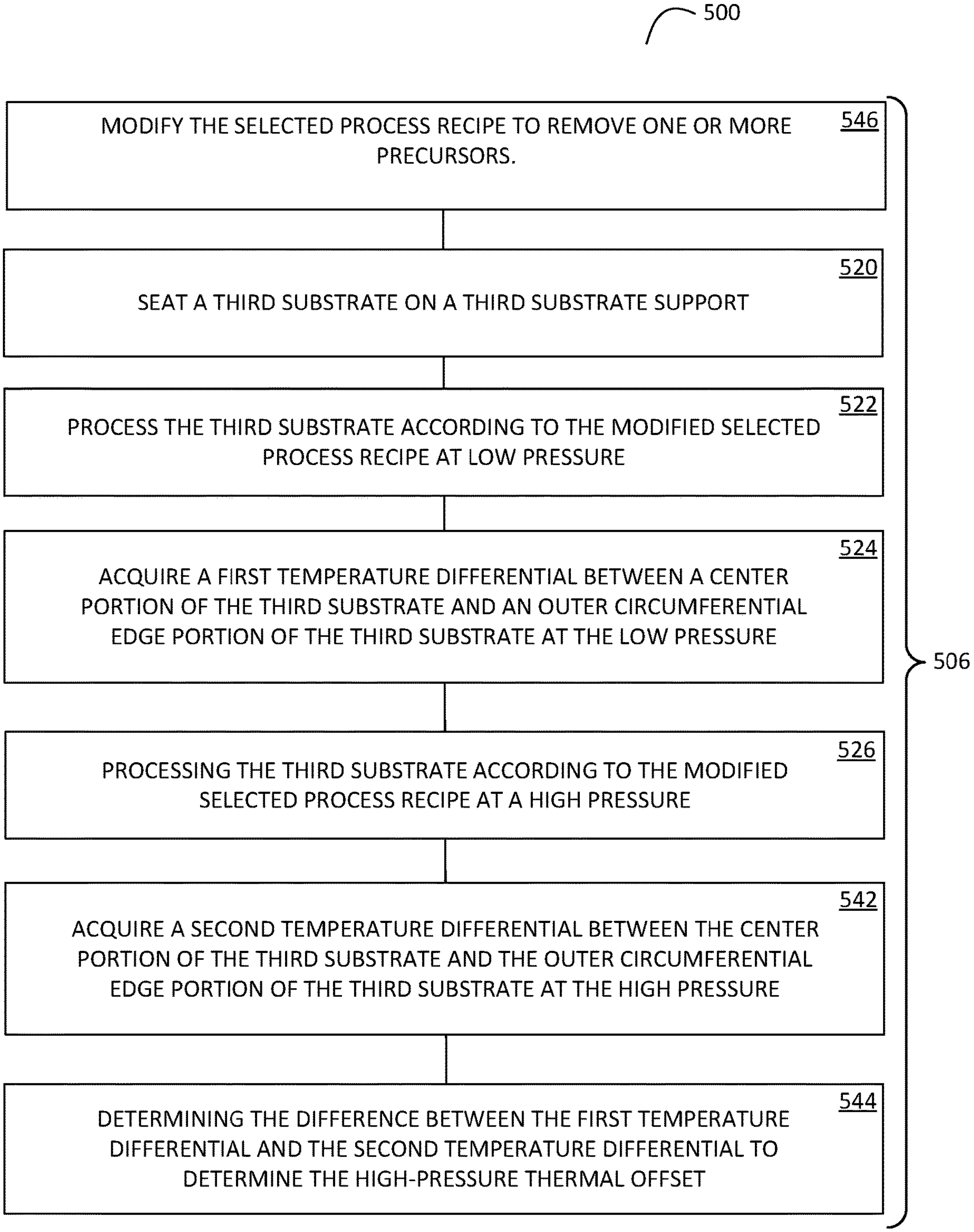
Figure 5E:
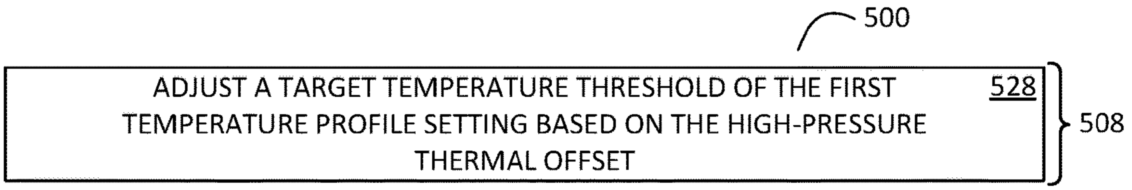
Figure 5F:
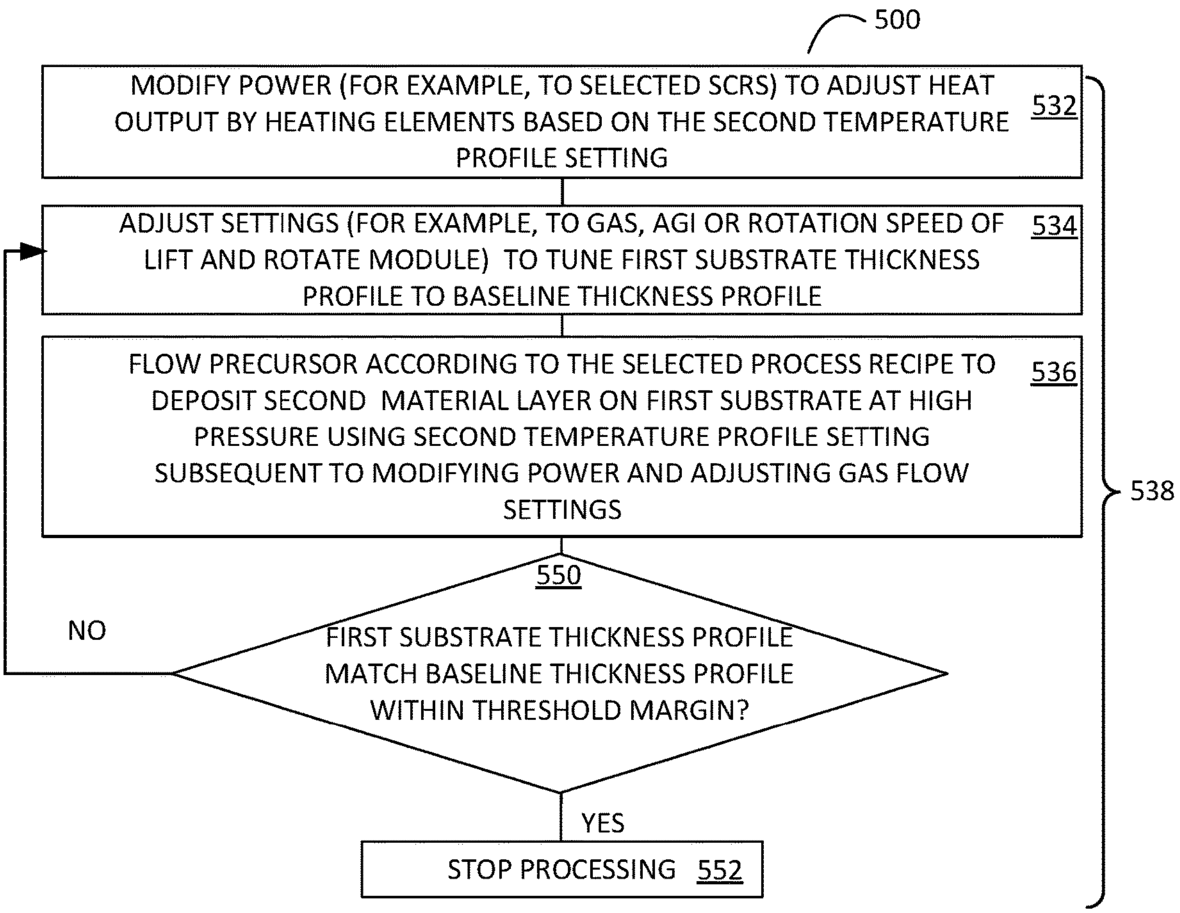
Figure 6:
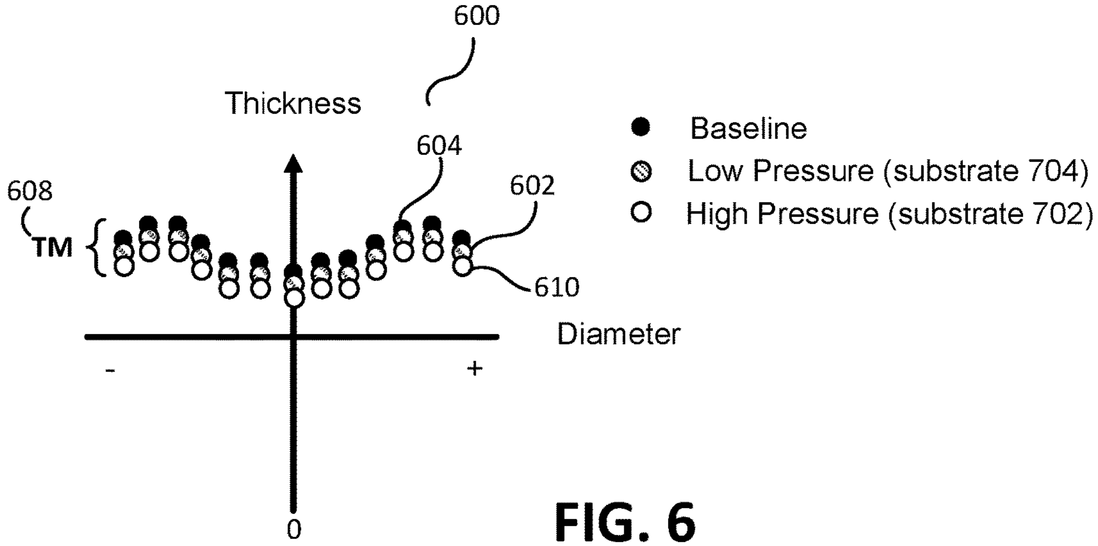
FIG. 6 is a graph illustrating various example substrate thickness profiles.
Figure 7:
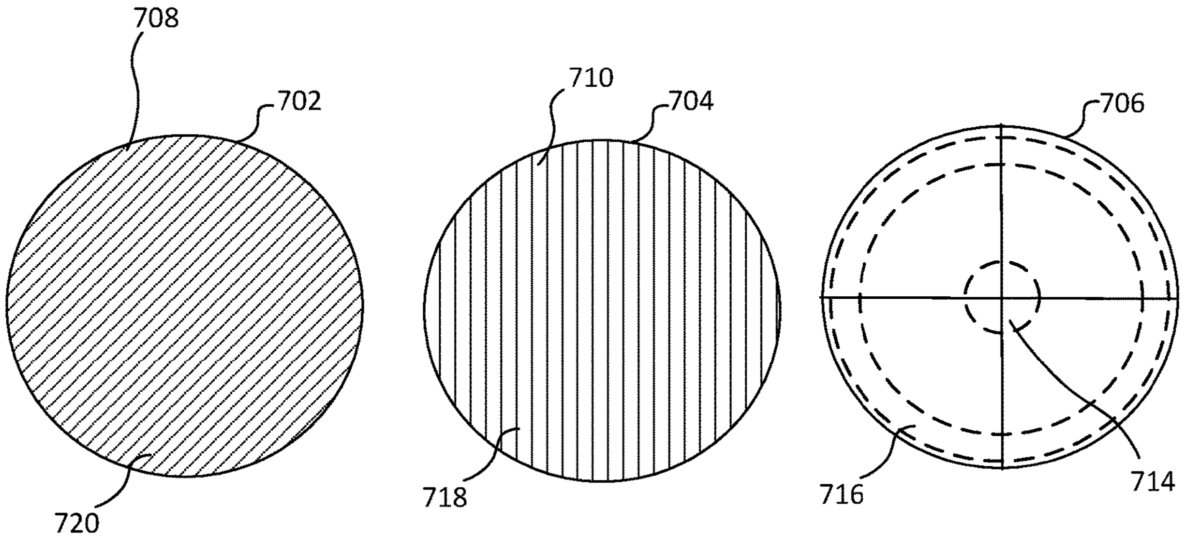
FIG. 7 is a schematic illustrating substrates processed according to the methods illustrated in FIGS. 5A-5E.

The following examples refer to FIGS. 5A-5F, 6 and 7. FIGS. 5A-5F illustrate various operations of a material layer deposition process 500 that may in some examples be executed by controller 226 (see FIG. 2). FIG. 6 is a graph 600 showing various substrate thickness profiles of substrates processed according to various operations of the material layer deposition process 500. FIG. 7 is a schematic showing various substrates processed according to various operations of the material layer deposition process 500.

In an example, process 500 comprises_a multi-part process the various parts of which may proceed in a single chamber arrangement 104 (see FIG. 3) or may take place utilizing one or more additional chamber arrangements (e.g., chamber arrangements 802 and 804 illustrated in FIG. 8) similar to chamber arrangement 104. In an example, process 500 includes processing of a first substrate 702, a second substrate 704 and a third substrate 706 (see FIG. 7). Such processing may take place in the same chamber or in different chambers. For the purposes of simplicity, in a non-limiting example, process 500 will be described with respect to a single chamber arrangement 104 herein. Chamber arrangement 104 may include chamber body 302 (see FIG. 3) having an upper wall 318 and a lower wall 320, a substrate support 304 arranged within an interior 332 of the chamber 302, an upper heater element array 306 supported above the upper wall 318 of the chamber body 302, a lower heater element array 308 supported below the lower wall 320 of the chamber body 302. Operations of process 500 may be controlled and/or executed by controller 226 to selectively operate valves (e.g., gate valve 360), flanges (e.g., flanges 338 and 340), manifolds, pumps, substrate support 304, lift and rotate module 358, heating elements (e.g., heater element arrays 306 and 308), temperature sensors (e.g., pyrometers 310 and 396 and thermocouples 312 and 398), SCR devices (e.g., upper SCR device 434 and lower SCR device 436 illustrated in FIG. 4) and other equipment included in semiconductor processing system 100.

FIG. 5A is a flow chart illustrating an example material layer deposition process 500. In an example, process 500 may begin at block 502 where a baseline substrate thickness profile 604 (see FIG. 6) for a selected process recipe (e.g., a process recipe for epitaxial growth of a phosphorous-doped silicon (SiP) material layer) to be performed at a high pressure may be acquired. In an example, the baseline substrate thickness profile 604 may be acquired by deposition at a desired temperature and high pressure onto a baseline substrate, film thickness and thickness profile are measured using thin film measurement techniques such as x-ray diffraction or other measurement techniques know to those of skill in the art. Process 500 may proceed to block 504, where a first temperature profile setting at low pressure for deposition of a first material layer 710 (see FIG. 7) of the selected process recipe may be determined. Process 500 may proceed to block 506 where a high-pressure thermal offset of the first temperature profile setting for the selected process recipe may be determined. At block 508, a second temperature profile setting for the selected process recipe at the high pressure may be determined based on application of the thermal offset to the first temperature profile setting. Process 500 may proceed to block 510 where a first substrate 702 (see FIG. 7) may be seated on a first substrate support. At block 538, a second material layer 708 may be deposited over the first substrate 702 at high pressure according to the selected process recipe using the second temperature profile setting.

Referring now to FIG. 5B where example operations for block 504 of process 500 (see FIG. 5A) are further illustrated in a flow chart. At block 512, a second substrate 704 (see FIG. 7) may be seated within chamber 302 (shown in FIG. 3) by substrate support 304. At block 514, in an example, determining the first temperature profile setting may comprise processing the second substrate 704 within a chamber 302 according to the selected process recipe including flowing the first material layer precursor (e.g., precursors 210, 212 shown in FIG. 2), at low pressure to deposit the first material layer 710 onto the second substrate 704. Heat may be communicated to the second substrate 704 during deposition via an upper heater element array, (e.g., the upper heater element array 306 shown in FIG. 4), and/or via lower heater element array, e.g., (lower heater element array 308 shown in FIG. 4). At block 516, the thickness profile of second substrate 704 may be measured across a surface 718 of second substrate 704 to characterize a low-pressure thickness profile 602 (see FIG. 6). The low-pressure thickness profile 602 may be measured using a thermal monitoring technique such as ellipsometry or another appropriate measuring instrument known to those of skill in the art. Processing at low pressure may be temperature sensitive and flow insensitive because at low pressure thermal monitoring of the substrate can be reliably measured using ellipsometry. At block 518, the low-pressure thickness profile 602 (see FIG. 6) of the second substrate 704 may be matched to the baseline substrate thickness profile 604 within a threshold margin 608 to find first temperature profile settings. In an example, threshold margin 608 may be a measurement within a percentage margin of the baseline substrate thickness profile 604 of within about 0.001 percent and 25 percent, about 0.01 percent and about 10 percent, about 0.1 percent and about 5 percent, and/or about 1 percent and about 3 percent, for example 2.5 percent. The first temperature profile settings may be used to achieve the desired low-pressure thickness profile 602 in subsequent processing.

FIG. 5C depicts an example operation for block 518 (see FIG. 5B) of process 500. At block 540, matching the second substrate thickness profile 602 may further comprise determining if the thickness profile of the first material layer 710

(see FIG. 7) on the second substrate 704 is within a threshold margin 608 (see FIG. 6) of the baseline substrate thickness profile 604.

Referring now to FIG. 5D where example operations for block 506 of process 500 (see FIG. 5A) are further illustrated in a flow chart. At block 546, the selected process recipe may be modified to remove one or more precursors. In an example, the modified process recipe may comprise flowing hydrogen ($H_2$) gas without precursors. At block 520, a third substrate 706 (see FIG. 7) may be seated within chamber 302 by substrate support 304. At block 522, determining the high-pressure thermal offset may comprise processing the third substrate 706 according to the modified selected process recipe (e.g., without any precursors) at low pressure (e.g., between about 0.1 Torr and about 50 Torr, between about 5 Torr and about 40 Torr, between about 10 Torr and about 30 Torr, and/or between about 15 Torr and about 25 Torr, for example about 20 Torr). More specifically, third substrate 706 may be exposed only to carrier/purge gasses 216 (see FIG. 2) without exposure to precursors 210 or 212. Thus, no material layer is grown or deposited in this step. At block 524, a first temperature differential between a center portion 714 of the third substrate 706 and an outer circumferential edge portion 716 of the third substrate 706 may be acquired at the low pressure. At block 526, the third substrate 706 may be processed according to the modified selected process recipe (e.g., without any precursors) at high pressure (e.g., between about 50 Torr and about 800 Torr, between about 100 Torr and about 700 Torr, between about 150 Torr and about 650 Torr, between about 200 Torr and about 500 Torr, and/or between about 250 Torr and about 400 Torr, for example 300 Torr). More specifically, third substrate 706 may be exposed only to carrier/purge gasses 216 (see FIG. 2) without exposure to precursors 210 or 212. Thus, no material layer is grown or deposited in this step. At block 542, a second temperature differential between a center portion 714 of the third substrate 706 and an outer circumferential edge portion 716 of the third substrate 706 may be acquired at the high pressure.

In an example, temperature readings of third substrate 706 may be monitored using any of a variety of appropriate thermal measurement instruments. For example, pyrometers (e.g., pyrometer 310 and/or pyrometer 398 as shown in FIG. 4) may be used to acquire low-pressure and high-pressure temperature readings. The temperature readings may be taken at a center portion 714 (see FIG. 7) of third substrate 706 along optical axis 374 of pyrometer 310 (see FIG. 3) and/or at a circumferential edge portion 716 (see FIG. 7) of third substrate 706 along optical axis 376 of pyrometer 398 (see FIG. 3). The center portion 714 and circumferential edge portion 716 temperatures may be taken at low pressure and at high pressure for comparison. Circumferential edge portion 716 may be co-axial with center portion 714. Alternatively, thermocouples (e.g., thermocouple 312 and/or thermocouple 398 as shown in FIG. 4) may be used to determine temperature. Thermocouple 312 may be disposed proximate a radial center portion of substrate support 304 and thermocouple 398 may be disposed at a circumferential edge portion of substrate support 304. Thus, thermocouple 312 may be used to acquire a temperature reading from central portion 714 of third substrate 706 and thermocouple 398 may be used to acquire a temperature reading from circumferential edge portion 716 of third substrate 706. In an example, the temperatures taken at center portion 714 and circumferential edge portion 716 may be taken at low pressure and at high pressure for comparison. Process 500 may proceed to block 544 where a high-pressure thermal offset may be determined by determining the difference between the first temperature differential and the second temperature differential.

In an example, a first temperature differential between center portion 714 of the third substrate 706 and outer circumferential edge portion 716 of the third substrate 706 at the low pressure may be compared with a second temperature differential between center portion 714 of the third substrate 706 and outer circumferential edge portion 716 of the third substrate 706 at the high pressure. The high-pressure thermal offset may be determined to be the difference between the first temperature differential and the second temperature differential going from low pressure to high pressure.

See for example, Table 1 below.

TABLE 1

| Pressure | T Center Portion | T Outer Circumferential Edge Portion | Temperature Differential |
|---|---|---|---|
| Low pressure (about 20 Torr) | 691.1° C. | 682.4° C. | 8.7° C. |
| High pressure (about 300 Torr) | 691.1° C. | 683.7° C. | 7.4° C. |
| | | Low to high pressure ΔT = high-pressure thermal offset | −1.3° C. |

In an example where a center portion 714 temperature is held constant (e.g., in Table 1), the high-pressure thermal offset may be determined by comparing at least a first temperature at the outer circumferential edge portion 716 of the third substrate 706 at the low pressure and at least a second temperature at the outer circumferential edge portion 716 of the third substrate 706 at the high pressure. In an example, a single substrate (e.g., third substrate 706) may be used to acquire first and second temperature differentials. Alternatively, different substrates may be used to acquire first and second temperature differentials.

Referring now to FIG. 5E where an example operation for block 508 of process 500 is illustrated at block 528. In block 528, applying the high-pressure thermal offset to the first temperature profile setting may further comprise adjusting (e.g., decreasing or increasing) a target temperature threshold of the first temperature profile setting based on the high-pressure thermal offset to determine the second temperature profile setting for the selected process recipe at high pressure. More specifically, applying the high-pressure thermal offset to the first temperature profile setting may comprise increasing or decreasing the target temperature threshold of the first temperature profile setting by the high-pressure thermal offset to determine the second temperature profile setting for the selected process recipe at high pressure.

Referring now to FIG. 5F where example operations for block 538 of process 500 are further illustrated in a flow chart. At block 532, power may be modified to adjust heat output by one or more heating elements based on the second temperature profile settings. For example, power may be modified to selected SCRs (e.g., upper SCRs 434 and/or lower SCRs 436) to adjust heat output by corresponding heating elements (e.g., heater element arrays 306 and 308) based on the second temperature profile settings. At block 534, gas flow settings (e.g., AGI settings) or rotation speed of lift and rotate module 358 may be adjusted so as to deposit the second material layer onto the first substrate 702 to match the first substrate thickness profile 610 to the baseline substrate thickness profile 604 to within the threshold margin 608. At block 536, one or more second material layer precursors (e.g., precursors 210, 212 shown in FIG. 2) may be flowed at high pressure across first substrate 702 to deposit second material layer(s) according on the selected process recipe using the second temperature profile setting, subsequent to modifying power and/or adjusting gas flow setting (e.g., AGI settings) or rotation speed of lift and rotate module 358. At block 550, determine whether the first substrate thickness profile 610 matches baseline substrate thickness profile within a threshold margin 608. If the first substrate thickness profile 610 matches baseline substrate thickness profile 604 within a threshold margin 608 then stop processing at block 552. If the first substrate thickness profile 610 does not match baseline substrate thickness profile 608 within a threshold margin 608 then return to processing at block 534.

Figure 8:
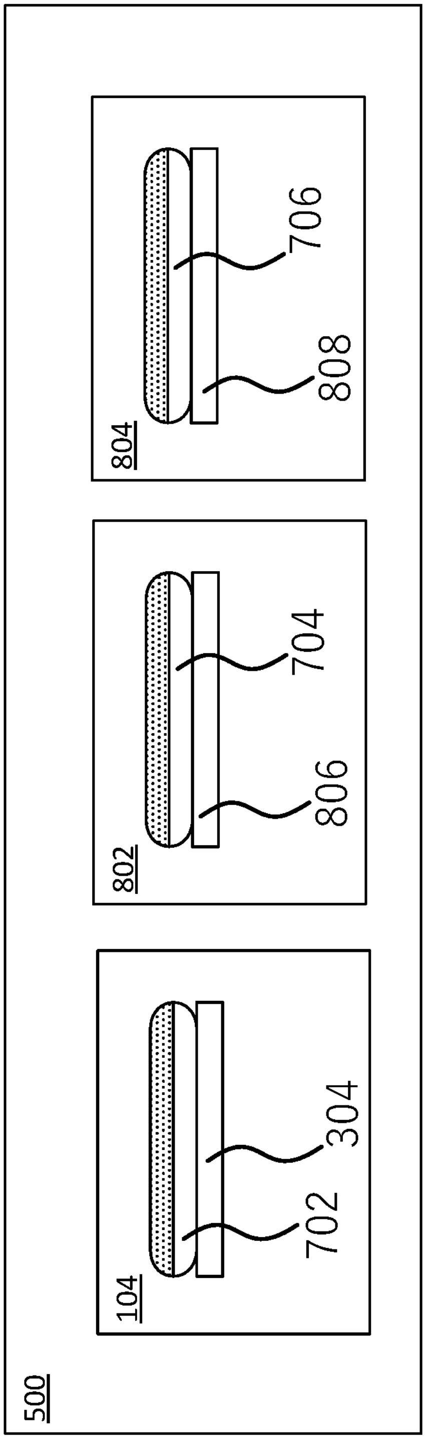
FIG. 8 is a schematic illustrating an example multiple chamber arrangement for processing substrates according to the methods illustrated in FIGS. 5A-5E.

FIG. 8 is a schematic illustrating multiple chamber arrangements for processing substrates 702, 704 and 706 according to process 500 illustrated in FIGS. 5A-5E. As noted hereinabove, processing of a first substrate 702, a second substrate 704 and a third substrate 706 (see FIG. 7) according to process 500 may proceed in a single chamber arrangement 104 (see FIG. 3) or may take place utilizing one or more additional chamber arrangements (e.g., chamber arrangements 802 and 804). In an example, chamber arrangement 104 may include a first substrate support (e.g., substrate support 304 configured to support substrate 702). Chamber arrangement 802 may include a second substrate support (e.g., substrate support 806 configured to support substrate 704). Chamber arrangement 804 may include a third substrate support (e.g., substrate support 808 configured to support substrate 706). Additional chamber arrangements and substrate supports are contemplated and may be utilized in carrying out process 500.

In examples described herein, optical temperature measurements from a pyrometer are employed to control an upper heater element array that directly heats a substrate and tactile temperature measurements from a thermocouple abutting a substrate support seating the substrate controls a lower heater element array indirectly heating the substrate through the bulk material forming the substrate support. Reliable substrate temperature control is achieved by avoid crosstalk between adjustments made to heat output of the lower heater element and heating of the substrate by the upper heater element array. Stabilization time may be reduced by elimination of the crosstalk, and control of the lower heater element array may be decoupled from control of the upper heater element array to enable adaptive power bias control.

Having described and illustrated the general and specific principles of examples of the presently disclosed technology, it should be apparent that the examples may be modified in arrangement and detail without departing from such principles. We claim all modifications and variations coming within the spirit and scope of the following claims.

The invention claimed is:

1. A material layer deposition method, comprising:

at a chamber arrangement including a chamber body, a first substrate support arranged within an interior of the chamber body, an upper heater element array supported above an upper wall of the chamber body, and a lower heater element array supported below a lower wall of the chamber body, acquiring a baseline substrate thickness profile for a selected process recipe;

determining a first temperature profile setting at a low pressure for deposition of a first material layer of the selected process recipe;

determining a high-pressure thermal offset for the first temperature profile setting;

applying the high-pressure thermal offset to the first temperature profile setting to determine a second temperature profile setting;

seating a first substrate on the first substrate support; and depositing a second material layer over the first substrate at a high pressure based on the selected process recipe using the second temperature profile setting.

2. The material layer deposition method of claim 1, wherein determining the first temperature profile setting further comprises:

seating a second substrate on a second substrate support;

processing the second substrate according to the selected process recipe including flowing a first material layer precursor at the low pressure to deposit the first material layer onto the second substrate;

measuring a second substrate thickness profile; and matching the second substrate thickness profile to the baseline substrate thickness profile to determine the first temperature profile setting.

3. The material layer deposition method of claim 2, wherein matching the second substrate thickness profile further comprises determining if the second substrate thickness profile is within a threshold margin of the baseline substrate thickness profile.

4. The material layer deposition method of claim 2, wherein determining the high-pressure thermal offset for the first temperature profile setting further comprises modifying the selected process recipe to remove one or more precursors.

5. The material layer deposition method of claim 4, wherein the high-pressure thermal offset is based on at least a first temperature of a third substrate at the low pressure and at least a second temperature of the third substrate at the high pressure.

6. The material layer deposition method of claim 4, wherein determining the high-pressure thermal offset further comprises:

seating a third substrate on a third substrate support;

processing the third substrate according to the modified selected process recipe at the low pressure;

acquiring a first temperature differential between a center portion of the third substrate and an outer circumferential edge portion of the third substrate at the low pressure;

processing the third substrate according to the modified selected process recipe at the high pressure;

acquiring a second temperature differential between the center portion of the third substrate and the outer circumferential edge portion of the third substrate at the high pressure; and determining a difference between the first temperature differential and the second temperature differential to determine the high-pressure thermal offset.

7. The material layer deposition method of claim 6, wherein the first substrate support, the second substrate support and the third substrate support are the same.

8. The material layer deposition method of claim 4, wherein the modified selected process recipe comprises hydrogen ($H_2$).

9. The material layer deposition method of claim 1, wherein depositing the second material layer over the first substrate at the high pressure according to the selected process recipe using the second temperature profile setting, further comprises:

modifying power to adjust heat output by one or more heating elements, based on the second temperature profile setting;

flowing precursor according to the selected process recipe to deposit the second material layer on the first substrate at the high pressure using the second temperature profile setting, subsequent to modifying power; and determining if a first substrate thickness profile matches the baseline substrate thickness profile within a threshold margin.

10. The material layer deposition method of claim 9, wherein depositing the second material layer over the first substrate at the high pressure according to the selected process recipe using the second temperature profile setting further comprises adjusting a gas flow setting so as to match the first substrate thickness profile to the baseline substrate thickness profile within the threshold margin.

11. The material layer deposition method of claim 1, wherein the selected process recipe is for epitaxial growth of a phosphorous-doped silicon (SiP) material layer.

12. The material layer deposition method of claim 1, wherein the low pressure is between about 0.1 Torr and about 50 Torr and the high pressure is between about 200 Torr and about 400 Torr.

13. The material layer deposition method of claim 1, wherein applying the high-pressure thermal offset to the first temperature profile setting comprises adjusting a target temperature threshold of the first temperature profile setting based on the high-pressure thermal offset.

14. A semiconductor processing system, comprising:

a precursor delivery arrangement;

a chamber arrangement connected to the precursor delivery arrangement;

a controller operatively connected to the precursor delivery arrangement and the chamber arrangement, the controller including a processor disposed in communication with a memory and responsive to instructions recorded on the memory to:

acquire a baseline substrate thickness profile for a selected process recipe;

determine a first temperature profile setting for depositing a first material layer at a low pressure for the selected process recipe;

determine a high-pressure thermal offset for the first temperature profile setting;

apply the high-pressure thermal offset to the first temperature profile setting to determine a second temperature profile setting;

seat a first substrate on a first substrate support within the chamber arrangement; and flow a second material layer precursor via the precursor delivery arrangement over the first substrate at a high pressure according to the selected process recipe using the second temperature profile setting.

15. The semiconductor processing system of claim 14, wherein to apply the high-pressure thermal offset to the first temperature profile setting, the controller, responsive to instructions recorded on the memory, is further to adjust a target temperature threshold of the first temperature profile setting based on the high-pressure thermal offset.

16. The semiconductor processing system of claim 14, wherein the controller, responsive to instructions recorded on the memory, is further to:

modify a power setting to adjust heat output by one or more heating elements, based on the second temperature profile setting;

adjust a gas flow setting so as to match a first substrate thickness profile to the baseline substrate thickness profile within a threshold margin; and flow precursor according to the selected process recipe to deposit one or more material layers on the first substrate at the high pressure using the second temperature profile setting, subsequent to modifying the power setting and adjusting the gas flow setting.

17. The semiconductor processing system of claim 14, wherein to determine the first temperature profile setting, the controller, responsive to instructions recorded on the memory, is further to:

seat a second substrate on a second substrate support;

process the second substrate according to the selected process recipe including flowing a first material layer precursor at the low pressure;

measure a second substrate thickness profile across the second substrate; and match the second substrate thickness profile to the baseline substrate thickness profile to determine the first temperature profile setting.

18. The semiconductor processing system of claim 17, wherein to match the second substrate thickness profile, the controller, responsive to instructions recorded on the memory, is further to determine if the second substrate thickness profile is within a threshold margin of the baseline substrate thickness profile.

19. The semiconductor processing system of claim 17, wherein to determine the high-pressure thermal offset, the controller, responsive to instructions recorded on the memory, is further to modify the selected process recipe to remove one or more precursors.

20. The semiconductor processing system of claim 19, wherein to determine the high-pressure thermal offset, the controller, responsive to instructions recorded on the memory, is further to compare at least a first temperature of a third substrate at the low pressure and at least a second temperature of the third substrate at the high pressure.

21. The semiconductor processing system of claim 19, wherein to determine the high-pressure thermal offset, the controller, responsive to instructions recorded on the memory, is further to:

seat a third substrate on a third substrate support;

process the third substrate according to the modified selected process recipe at the low pressure;

acquire a first temperature differential between a center portion of the third substrate and an outer circumferential edge portion of the third substrate at the low pressure;

process the third substrate according to the modified selected process recipe at the high pressure;

acquire a second temperature differential between the center portion of the third substrate and the outer circumferential edge portion of the third substrate at the high pressure; and determine the high-pressure thermal offset by determining a difference between the first temperature differential and the second temperature differential.

22. The semiconductor processing system of claim 21, wherein the first substrate support, the second substrate support and the third substrate support are the same.

23. The material layer deposition method of claim 2, wherein flowing the first material layer precursor comprises flowing dichlorosilane and hydrochloric acid to deposit the first material layer onto the second substrate.

24. The semiconductor processing system of claim 14, wherein the second material layer precursor comprises dichlorosilane and hydrochloric acid.

* * * * *